United States Patent [19]

Zorinsky et al.

[11] Patent Number: 4,628,591

[45] Date of Patent: Dec. 16, 1986

[54] METHOD FOR OBTAINING FULL OXIDE ISOLATION OF EPITAXIAL ISLANDS IN SILICON UTILIZING SELECTIVE OXIDATION OF POROUS SILICON

[75] Inventors: Eldon J. Zorinsky; David B. Spratt, both of Plano, Tex.

[73] Assignee: Texas Instruments Incorporated, Dallas, Tex.

[21] Appl. No.: 666,698

[22] Filed: Oct. 31, 1984

[51] Int. Cl.$^4$ .................. H01L 21/306; H01L 21/76
[52] U.S. Cl. ............................. 29/576 W; 29/576 B; 29/576 E; 29/578; 29/580; 148/175; 148/1.5; 148/DIG. 26; 148/DIG. 50; 148/DIG. 85; 156/647; 156/649; 156/653; 156/657; 204/34.5; 204/129.1; 204/129.3
[58] Field of Search .............. 29/576 I, 576 B, 576 E, 29/578, 580; 148/175, 1.5, DIG. 85, DIG. 26, DIG. 50; 156/647, 649, 653, 657; 357/49, 50; 204/325, 129.1, 129.3, 32 S-34.5

[56] References Cited

U.S. PATENT DOCUMENTS

| | | | |
|---|---|---|---|
| 3,386,865 | 6/1968 | Doo | 148/175 |
| 3,640,806 | 2/1972 | Watanabe et al. | 148/DIG. 85 |
| 3,919,060 | 11/1975 | Pogge et al. | 204/129.3 |
| 3,954,523 | 5/1976 | Magdo et al. | 148/175 |
| 4,016,017 | 4/1977 | Oboaf et al. | 148/1.5 X |
| 4,104,090 | 8/1978 | Pogge | 29/576 W X |
| 4,380,865 | 4/1983 | Frye et al. | 29/576 W |
| 4,393,577 | 7/1983 | Imai | 29/576 B |

FOREIGN PATENT DOCUMENTS

| | | | |
|---|---|---|---|
| 56-56648 | 5/1981 | Japan | 29/576 W |
| 57-149749 | 9/1982 | Japan | 29/576 W |
| 58-192344 | 11/1983 | Japan | 29/576 W |

OTHER PUBLICATIONS

Holmstrom et al, "Complete Dielectric Isolation by Highly Selective and Self-Stopping Formation of Porous Silicon", Appl. Phys. Lett., 42(4) pp. 386-388, 2/15/83.

Imai, "A New Dielectric Isolation Method Using Porous Silicon", Solid State Electronics, vol. 24, pp. 159-164, 1981.

Unagami et al., "Study of the Injection Type IPOS Scheme", Japanese Journal of Applied Physics, vol. 16, No. 9, pp. 1635-1640, 9/77.

Imai et al., "Full Isolation Technology by Porous Oxidized Silicon and Its Application to LSI", IDEM, pp. 376-379, 1981.

Teng, "An Investigation of the Application of Porous Silicon Layers to the Dielectric Isolation of Integrated Circuits", J. Electrochem. Soc. Solid State Science and Technology, pp. 870-874.

Doo et al., "Making Monolithic . . . Isolation Techniques", I.B.M. Tech. Discl. Bull., vol. 8, No. 4, Sep. 1965, pp. 659-660.

Watanabe et al., "Formation and Properties of Porous Silicon . . . ", J. Electrochem. Soc., vol. 122, No. 10, Oct. 1975, pp. 1351-1355.

*Primary Examiner*—William G. Saba
*Attorney, Agent, or Firm*—Richard A. Bachand; N. Rhys Merrett; Melvin Sharp

[57] ABSTRACT

Full oxide isolation of epitaxial islands can be accomplished by oxidizing suitably porous silicon. The porous silicon can be created by anodizing highly doped n+ silicon in hydroflouric acid. Lesser doped epitaxial regions will not become porous and will become isolated islands suitable for the fabrication of semiconductor devices.

7 Claims, 7 Drawing Figures

METHOD FOR OBTAINING FULL OXIDE ISOLATION OF EPITAXIAL ISLANDS IN SILICON UTILIZING SELECTIVE OXIDATION OF POROUS SILICON

BACKGROUND AND SUMMARY OF THE INVENTION

This invention relates generally to fabrication of integrated circuits, and more specifically to formation of oxide isolated epitaxial islands.

Isolation of individual elements found in integrated circuit devices becomes more important and more difficult as integrated circuits increase in complexity. Transistor sizing and spacing are constantly becoming smaller in order to realize increased circuit densities on an integrated circuit chip.

Improved isolation can be obtained if all active devices are isolated by an oxide insulator underneath as well as on all sides. Such complete isolation would eliminate the potential of latchup in CMOS circuits, and decrease parasitic capacitances in all types of active devices. In addition, total oxide isolation would allow active devices to be closely spaced.

It is therefore an object of the present invention to provide a method of fabricating totally oxide isolated epitaxial islands.

Therefore, according to the present invention, isolated epitaxial islands are formed by the anodic formation of porous silicon which is then converted to silicon dioxide. The islands are formed by creating a moderately doped island area resting on top of a thin, lightly doped layer. This island area is surrounded by highly doped epitaxial silicon, which is converted to porous silicon by an anodic process. The inclusion of the thin, lightly doped layer underneath the island causes the lower surface of the island to be planar, and improves island definition.

The novel features which characterize the present invention are defined by the appended claims. The foregoing and other objects and advantages of the present invention will hereinafter appear, and for purposes of illustration, but not of limitation, several preferred embodiments are shown in the accompanying drawings.

DESCRIPTION OF THE PREFERRED EMBODIMENTS

Figure 1:
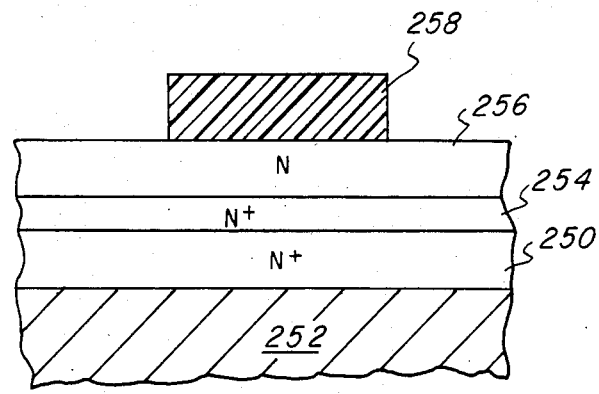
FIGS. 1 through 3 demonstrate a preferred method for fabricating oxide isolated epitaxial islands according to the present invention.
Figure 2:
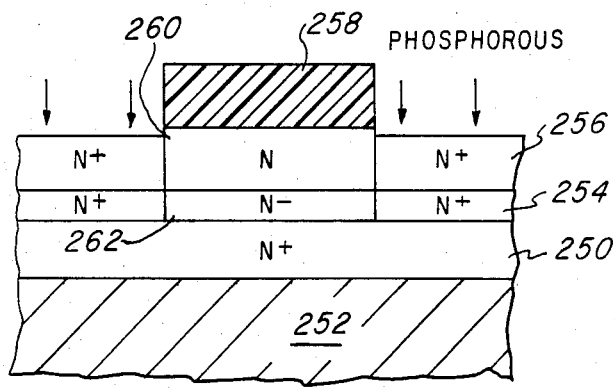
Figure 3:
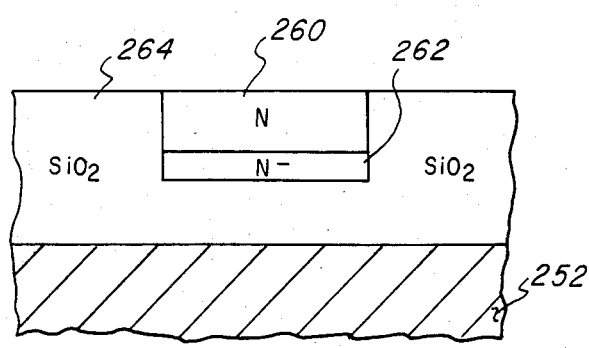

Isolated epitaxial island suitable for use with the fabrication of bipolar and IGFET transistors, can be formed as will be described. One preferred method is illustrated in FIGS. 1-3. Referring to FIG. 1, a first N+ epitaxial layer 250 is grown on a silicon substrate 252. An optional second epitaxial layer 254, having a much lower dopant concentration the first layer 250 is then grown. The preferred method includes this layer 250 as shown. Inclusion of this layer 254, which can be virtually undoped, creates an abrupt junction with layer 254, which improves the anodization process described below. A third epitaxial layer 256 having a concentration between that of the first and second layers 250,254 is then grown. This thrd epitaxial layer 256 will eventually form the epitaxial islands in which devices will be fabricated. A layer of silicon nitride 258 is then formed over the third epitaxial layer 256 and patterned as shown in FIG. 1.

Referring to FIG. 2, a high energy phosphorous implant is made to convert the second and third epitaxial layers 254,256 to highly doped N+ of a concentration substantially equal to that of the first epitaxial layer 250. The only areas not converted are those defined by the nitride mask 258. The resulting structure is basically an island of moderately n-type material 260, with a thin layer of very lightly doped n-type material 262 below it. Surrounding this island on all sides is highly doped n-type epitaxial material 250,254 and 256.

The substrate as shown in FIG. 2 is now ready for anodization in order to convert the highly doped N+ regions to porous silicon, which is then converted to silicon oxide. Such a process and mechanism for performing this conversion is described in the article "Complete Dielectric Isolation By Highly Selective and Self-Stopping Formation of Oxidized Porous Silicon" by R. P. Holmstrom and J. Y. Chi, published in Applied Phyics Letters, Volume 42, No. 4, Feb. 15, 1983. A preferred method and apparatus for creating porous silicon will be described below.

Referring to FIG. 3, anodization in HF and subsequent oxidation of the porous silicon thus formed converts the N+ layers to oxide 264. This results in an n-type epitaxial tank 260, riding atop a very thin n-type region 262, the size of which is exaggerated in FIGS. 1-3, surround on all sides by silicon oxide 264.

Figure 4:
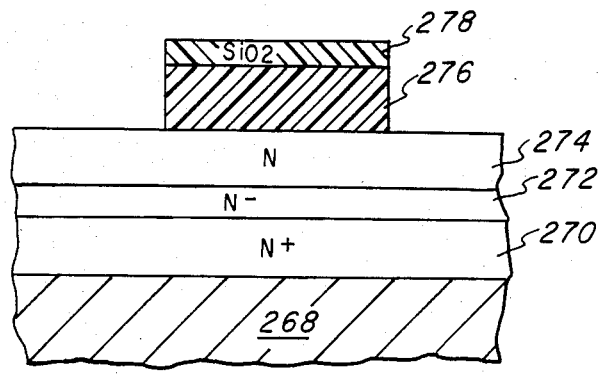
FIGS. 4 through 6 illustrate an alternative embodiment for fabricating oxide isolated epitaxial islands according the present invention.
Figure 5:
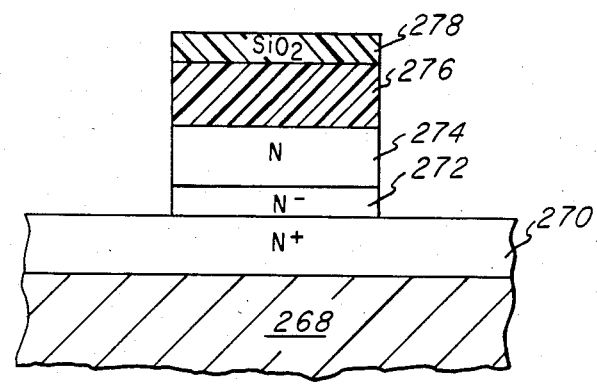
Figure 6:
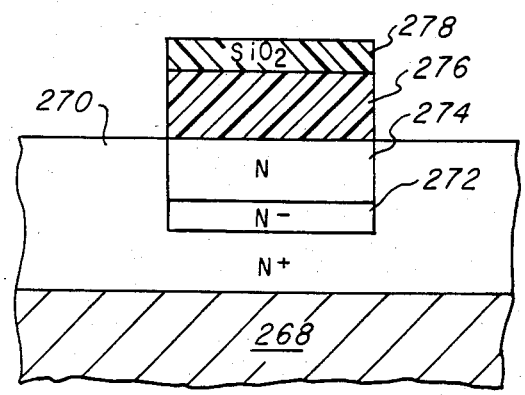

Another method for forming isolated islands is shown in FIGS. 4–6. First 270, second 272 and third 274 doped epitaxial layers are formed on a substrate 268 as described in FIG. 1. A nitride layer 276 is then deposited, followed by an oxide layer 278. The oxide and nitride layers 278,276 are then patterned. The purpose of the oxide layer 276 is to minimize the number of polysilicon nucleation sites in a later selective epitaxial growth step as described in connection with FIG. 6.

Referring to FIG. 5, the patterned oxide 278 and nitride 276 act as a mask, and the exposed portions of the moderately doped 274 and very lightly doped 272 epitaxial layers are etched away.

Referring to FIG. 6, highly doped epitaxial silicon, preferably having a dopant concentration identical with that of the first epitaxial layer 270, is then selectively grown in order to surround the moderately and lightly doped island area 274 and 272 with highly doped N+ epitaxial silicon 270. This results in the structure of FIG. 6. This structure can now be anodized and oxidized as described above to result in the isolated epi island shown in FIG. 3.

The alternative processes described above result in N-type epitaxial islands 260 and 274 surrounded by an oxide insulating layer 264. These islands are suitable for fabrication of bipolar and MOS devices therein. P-type islands can be formed by diffusing or implanting and annealing boron into the n-type island 260 or 274 after the anodization step. Since the boron will not diffuse through the surrounding oxide 264, mask alignment and annealing times are not critical.

Figure 7:
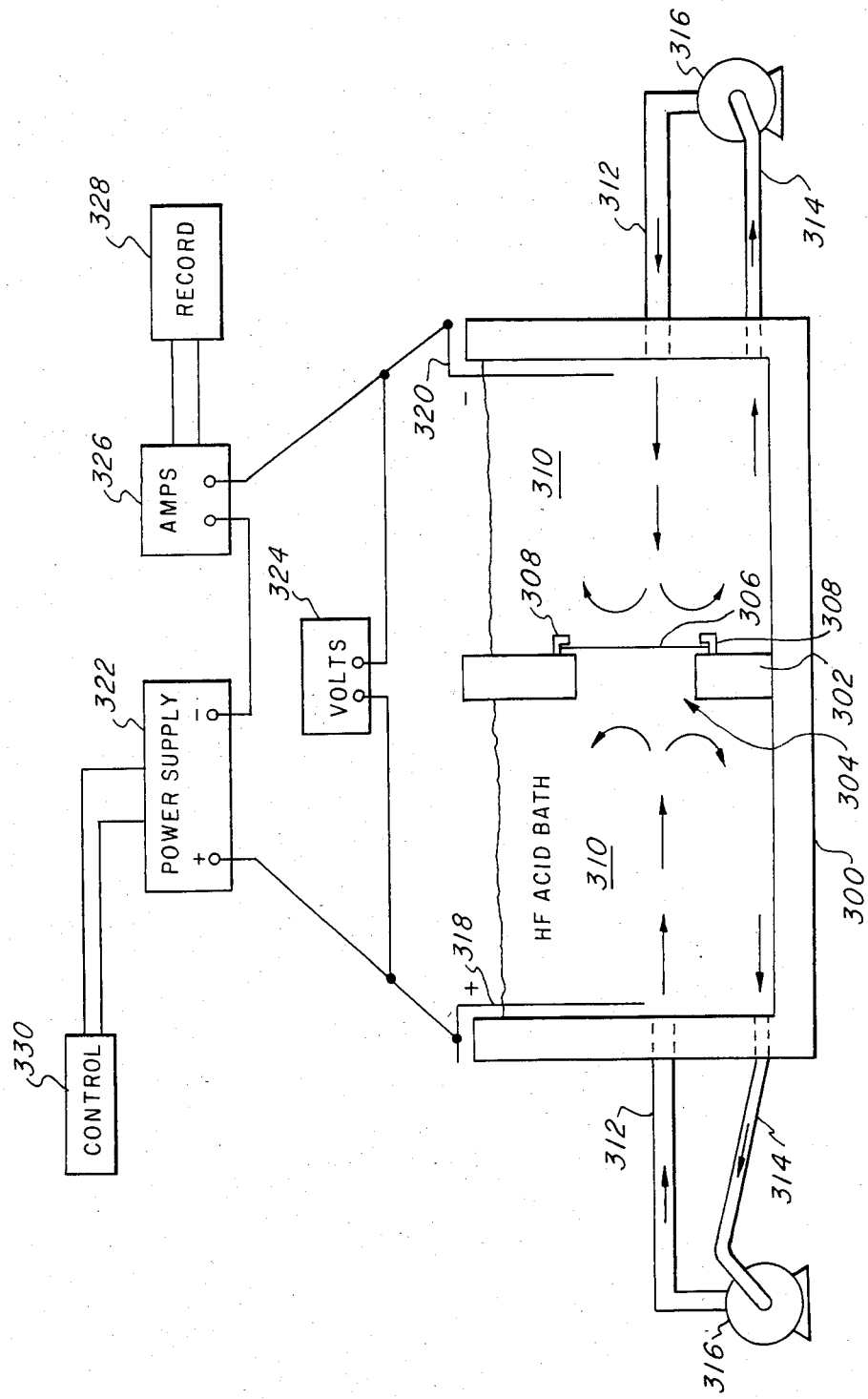
FIG. 7 illustrates a preferred system for performing anodic formation of porous silicon.

Referring to FIG. 7, a preferred system for anodic formation of porous silicon in a silicon wafer containing integrated circuit devices is shown. The container 300 has a centrally located divider 302 which has an opening 304 therein. The opening 304 is sized slightly smaller than a semiconductor wafer 306, which is held by support 308 so as to completely cover the opening 304. The combination of divider 302 and slice 306 divides by container 300 into two parts, with fluids being unable to flow between the parts. The two parts of the container 300 are filled with hydrofloric acid 310 which is continuously recirculated through incoming piping 312 and outgoing piping 314 by pumps 316.

Positive and negative electrodes, 318 and 320 are inserted into the acid bath and coupled to a power supply 322. Voltmeter 324 and ammeter 326 are used to monitor the action of the etching process. A recording device 328, such as a chart recorder, is used to record the etching of slices 306. The power supply 322 can be variably controlled by control device 330. Control 330 may be a simple variable potentiometer, or a computer controlled device. If control 330 is a computer controlled device, recording device 328 can be incorporated therein, and plots of voltage and current versus time can be made.

When the system is energized, current will flow between the electrodes 318 and 320, rendering the highly doped N-type silicon porous as described in connection with FIGS. 2 and 3. The anodic etching should be carried out until the porous silicon is approximately half etched away. When the porous silicon is then oxidized, the oxide will expand to fill substantially the original space occupied by the highly doped silicon, thus causing minimal deformation of the integrated circuit chips.

The present invention has been illustrated by the methods and structures described above, and it will become apparent to those skilled in the art that various modifications and alterations may be made thereto. Such variations fall within the ambit of the present invention, the scope of which is defined by the appended claims.

What is claimed is:

1. A method for forming an isolated n type epitaxial island on an n type silicon chip, comprising the steps of:
   (a) forming highly doped n type epitaxial silicon on said chip;
   (b) forming moderately doped n type epitaxial silicon on said highly doped epitaxial silicon;
   (c) selectively implanting ions in at least said moderately doped epitaxial silicon to selectively dope said moderately doped epitaxial silicon to a level approximately equal to the doping level of said highly doped epitaxial silicon, thereby creating an island of moderately doped epitaxial silicon surrounded at its sides and bottoms by highly doped epitaxial silicon;
   (d) exposing the chip in an anodizing agent and voltage whereby porous silicon is selectively formed only in the highly doped epitaxial silicon; and
   (e) oxidizing the porous silicon to form silicon dioxide in the porous silicon, thereby forming an isolated n type epitaxial island on the chip.

2. The method of claim 1, wherein the porous silicon has a density approximately equal to one-half that of epitaxial silicon.

3. The method of claim 1 further comprising forming a thin layer of lightly doped silicon under said moderately doped n type epitaxial silicon region prior to the formation of the highly doped n type epitaxial silicon surrounding and underneath the moderately doped regions.

4. The method of claim 1 wherein said step of exposing the chip to an anodizing agent comprises exposing the chip to hydroflouric acid to form porous silicon in the highly doped regions.

5. A method for forming an isolated n type epitaxial island on an n type silicon chip, comprising the steps of:
   (a) forming highly doped n type epitaxial silicon on said chip;
   (b) forming moderately doped n type epitaxial silicon on said higly doped epitaxial silicon;
   (c) selectively removing the moderately doped epitaxial silicon in regions surrounding an island of moderately doped epitaxial silicon;
   (d) selectively forming in said regions from which said moderately doped epitaxial silicon was removed epitaxial silicon having a doping level approximately equal to the doping level of said highly doped epitaxial silicon, thereby creating an island of moderately doped epitaxial silicon surrounded at its sides and bottoms by highly doped epitaxial silicon;
   (e) exposing the chip to an anodizing agent and voltage whereby porous silicon is selectively formed only in the highly doped epitaxial silicon; and
   (f) oxidizing the porous silicon to form silicon dioxide in the porous silicon, thereby forming an isolated n type epitaxial island on the chip.

6. The method of claim 5 further comprising forming a thin layer of lightly doped silicon under said moderately doped n type epitaxial silicon region prior to the formation of the highly doped n type epitaxial silicon surrounding and underneath the moderately doped regions.

7. The method of claim 6 wherein said step of exposing the chip to an anodizing agent comprises exposing the chip to hydrofluoric acid to form porous silicon in the highly doped regions.

* * * * *